(12) United States Patent
Nam (10) Patent No.: US 7,385,859 B2
(45) Date of Patent: Jun. 10, 2008

(54) SEMICONDUCTOR MEMORY DEVICES AND METHODS FOR GENERATING COLUMN ENABLE SIGNALS THEREOF

(75) Inventor: Kyung-Woo Nam, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 186 days.

(21) Appl. No.: 11/446,291

(22) Filed: Jun. 5, 2006

(65) Prior Publication Data

US 2007/0036009 A1    Feb. 15, 2007

(30) Foreign Application Priority Data

Aug. 11, 2005    (KR) .................. 10-2005-0073924

(51) Int. Cl.
 *G11C 7/00* (2006.01)
(52) U.S. Cl. .................. 365/194; 365/233; 365/189.04
(58) Field of Classification Search ................ 365/194, 365/233, 189.04, 189.05, 230.08
See application file for complete search history.

(56) References Cited

U.S. PATENT DOCUMENTS 5,566,108 A * 10/1996 Kitamura ............... 365/189.14
5,959,936 A     9/1999 Seo
6,343,036 B1 *  1/2002 Park et al. .................. 365/193
6,456,563 B1    9/2002 Kajimoto

FOREIGN PATENT DOCUMENTS

KR    1020010058380 A    7/2001

* cited by examiner

*Primary Examiner*—Tuan T. Nguyen
*Assistant Examiner*—Toan Le
(74) *Attorney, Agent, or Firm*—Harness, Dickey & Pierce, P.L.C.

(57) ABSTRACT

A semiconductor memory device includes a column enable signal generator, a row enable signal generator and a final column enable signal generator. The column signal enable generator may generate a latency control signal and generating a buffered clock signal as a column enable signal in response to the latency control signal. The row enable signal generator may generate a row enable signal. The final column enable signal generator may generate a first signal in response to the column enable signal, a second signal in response to the row enable signal, and may output the first and/or the second signal as a final column enable signal.

20 Claims, 11 Drawing Sheets

SEMICONDUCTOR MEMORY DEVICES AND METHODS FOR GENERATING COLUMN ENABLE SIGNALS THEREOF

PRIORITY STATEMENT

This non-provisional patent application claims priority under 35 U.S.C. § 119 to Korean Patent Application No. 10-2005-0073924, filed Aug. 11, 2005 in the Korean Intellectual Property Office (KIPO), the entire contents of which are incorporated herein by reference.

BACKGROUND OF THE INVENTION

1. Field of the Invention

Example embodiments of the present invention relate to semiconductor memory devices. For example, at least some example embodiments of the present invention provide semiconductor memory devices operating with a latency dependent on a frequency of an external clock signal and methods for generating a column enable signal thereof.

2. Description of The Conventional Art

A conventional semiconductor memory device may operate with a latency dependent on an external clock signal frequency. However, even though the latency may vary, a row enable signal may be activated constantly and may maintain the activation state during a time period before deactivation. On the other hand, a column enable signal may be delayed for a clock cycle corresponding to the latency prior to activation. For example, even though the latency may vary, an activation time of the row enable signal may be the same or substantially the same, while an activation time of the column enable signal may vary.

Figure 1:
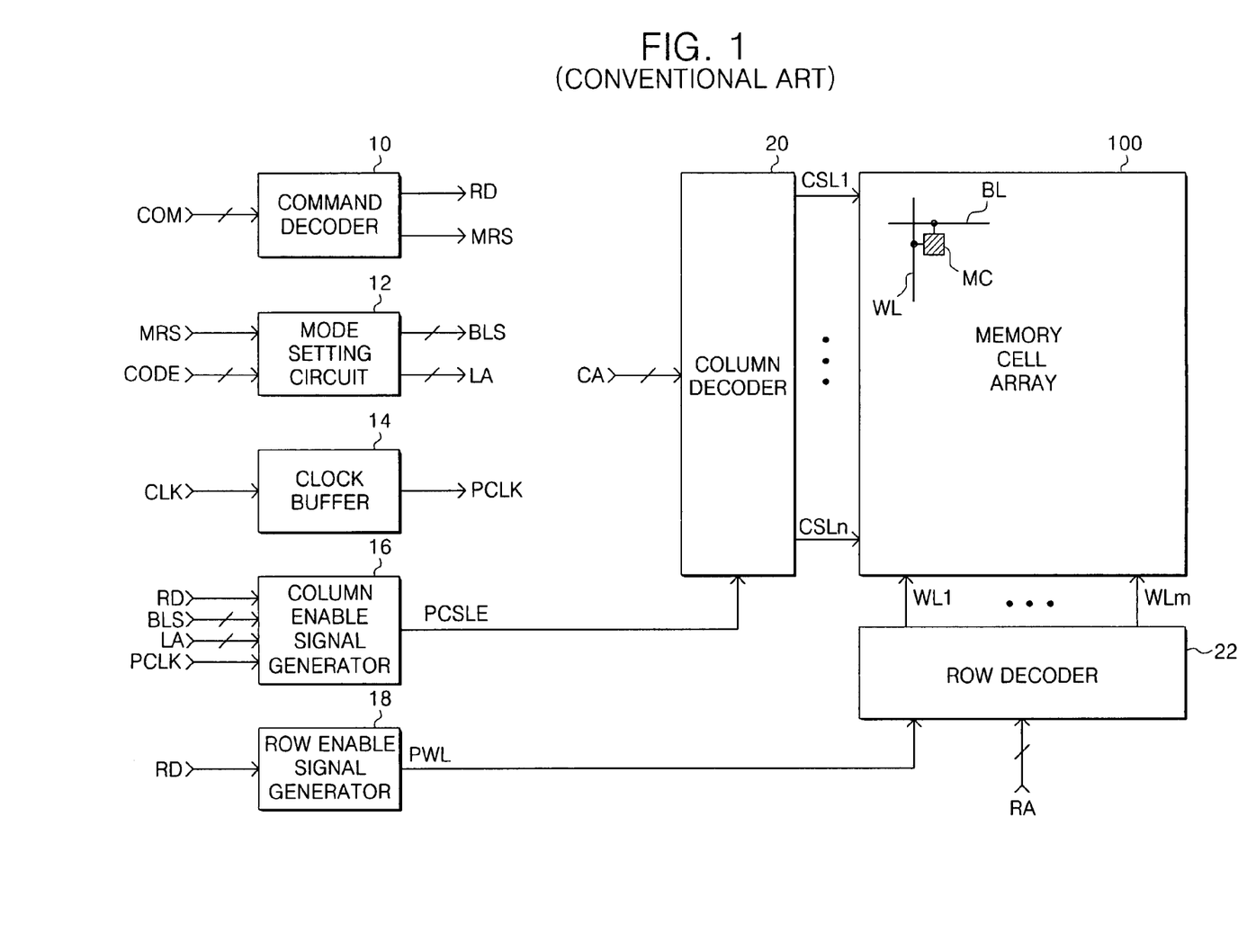
FIG. 1 is a block diagram illustrating a conventional semiconductor memory device.

FIG. 1 is a block diagram illustrating a conventional semiconductor memory device. The conventional semiconductor memory device of FIG. 1 may include a memory cell array 100, a command decoder 10, a mode setting circuit 12, a clock buffer 14, a column enable signal generator 16, a row enable signal generator 18, a column decoder 20 and a row decoder 22. In FIG. 1, "MC" denotes a representative memory cell, "BL" denotes a representative bit line and "WL" denotes a representative word line.

The command decoder 10 may decode a command signal COM applied from an external source to generate a read command RD and a mode setting command MRS. The mode setting circuit 12 may receive a code CODE applied from an external source to generate a burst length signal BLS and a latency signal LA in response to the mode setting command MRS. The clock buffer 14 may buffer an external clock signal CLK to generate a buffered clock signal PCLK. The column enable signal generator 16 may receive the read command RD, the burst length signal BLS, the latency signal LA, and the buffered clock signal PCLK, and may generate a latency control signal (not shown). The latency control signal may be activated after being delayed for a clock cycle corresponding to the latency signal LA after the read command RD is applied. The column enable signal generator 16 may deactivate the latency control signal after being activated for a clock cycle corresponding to the burst length signal BLS and may generate the buffered clock signal PCLK as a column enable signal PCSLE in response to the latency control signal.

The row enable signal generator 18 may generate a row enable signal PWL, which may be activated after a time period, and may be deactivated after being activated for a time period. The row enable signal generator 18 may generate the row enable signal PWL in response to the read command RD. The column decoder 20 may decode a column address CA to activate one of n column selecting signals CSL1 to CSLn in response to the column enable signal PCSLE. The row decoder 22 may decode a row address RA to activate one of m word line selecting signals WL1 to WLm in response to the row enable signal PWL.

Figure 2:
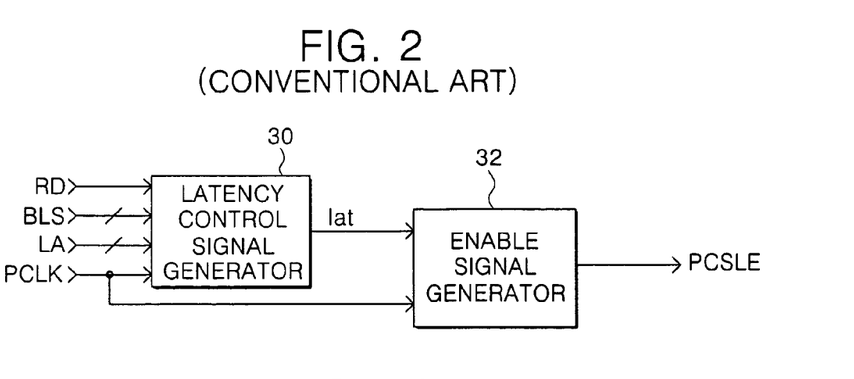
FIG. 2 is a block diagram illustrating a conventional column enable signal generator of the semiconductor memory device of FIG. 1.

FIG. 2 is a block diagram illustrating the column enable signal generator of the conventional semiconductor memory device of FIG. 1. The column enable signal generator of FIG. 2 may include a latency control signal generator 30 and an enable signal generator 32.

The latency control signal generator 30 may activate a latency control signal lat after being delayed in response to the buffered clock signal PCLK and after the read command RD is generated. The delay may comprise a clock cycle corresponding to the latency signal LA. The latency control signal generator 30 may deactivate the latency control signal lat using the buffered clock signal PCLK after maintaining the activation state for a clock cycle corresponding to the burst length signal BLS. The enable signal generator 32 may generate the buffered clock signal PCLK as the column enable signal PCSLE in response to the latency control signal lat.

Figure 3A:
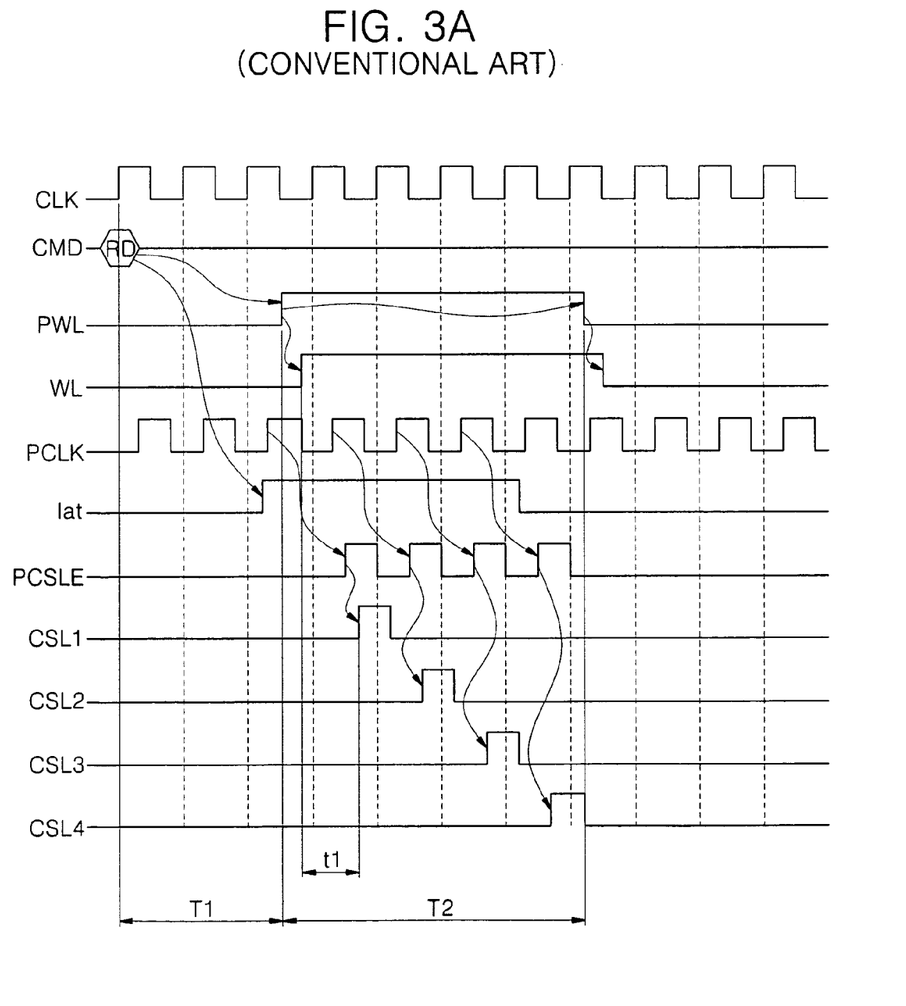
FIGS. 3A and 3B are timing diagrams illustrating an example operation of the semiconductor memory device of FIG. 1.

FIG. 3a is a timing diagram illustrating an example operation of the semiconductor memory device of FIG. 1. In the example shown in FIG. 3A, the latency signal LA is set to 2, and the burst length signal BLS is set to 4. A latency signal LA set to 2 indicates that data may be read 2 clock cycles after the read command RD is generated. The burst length signal BLS set to 4 indicates that 4 data may be output sequentially through one data output pin.

Referring to FIG. 3a, when the read command RD is applied, the row enable signal PWL may be activated a time T1 after (and in response to) the read command RD and may be deactivated after a time T2. The row decoder 22 may decode the row address RA to activate one word line selecting signal WL in response to the row enable signal PWL. The latency control signal generator 30 may generate the latency control signal lat after the read command RD is applied, and the latency control signal lat may be active being delayed for 2 clock cycles corresponding to the latency signal 1a. The latency control signal lat may be deactivated after maintaining the activation state for 4 clock cycles corresponding to the burst length signal BLS. The enable signal generator 32 may generate the buffered clock signal PCLK as the column enable signal PCSLE in response to the latency control signal lat. Thus, 4 column enable signals PCSLE may be generated sequentially. The column decoder 20 may decode the column address CA to activate a first column selecting signal CSL1 in response to the column enable signal PCSLE. Second to fourth column selecting signals CSL2 to CSL4 may be activated sequentially. Although not shown, the row address RA and/or a first column address CA may be applied concurrently with the command signal CMD. The row address RA may be applied to the row decoder 22, the first column address CA may be applied to an internal address generator (not shown), and the internal address generator (not shown) may sequentially generate 4 column addresses corresponding to the burst length signal BLS.

Figure 3B:
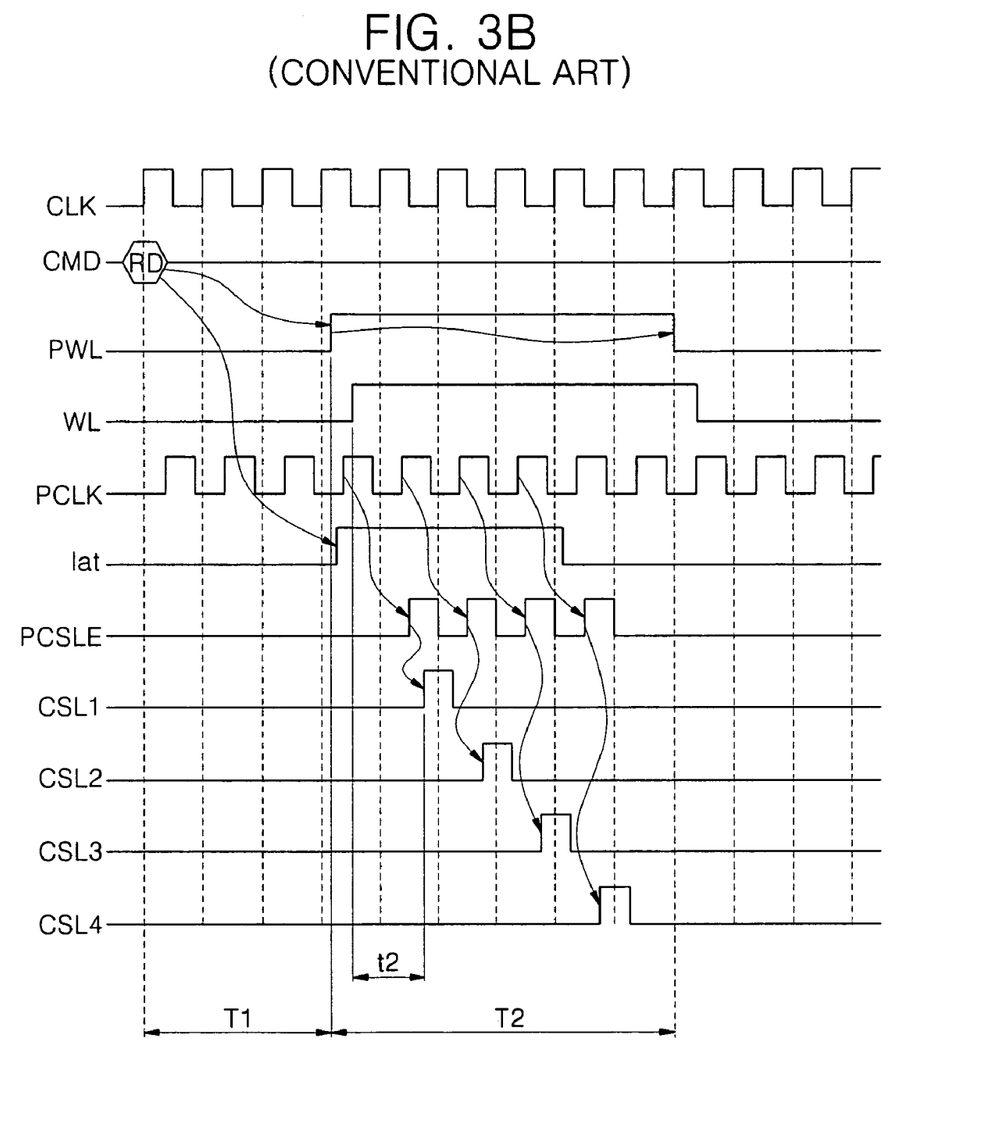

FIG. 3B is a timing diagram illustrating an example operation of the semiconductor memory device of FIG. 1 in which a frequency of the clock signal CLK is higher than the frequency of the clock signal CLK of FIG. 3A, the latency signal LA is set to 3 and the burst length signal BLS is set to 4.

In FIG. 3B, the row enable signal PWL may be generated in the same or substantially the same manner as in FIG. 3A. The clock buffer 14 may buffer the clock signal CLK to generate the buffered clock signal PCLK. The row decoder 22 may decode the row address RA to activate one word line selecting signal WL in response to the row enable signal PWL. The latency control signal generator 30 may generate the latency control signal lat after the read command RD is applied. The latency control signal lat may be activated after being delayed for 3 clock cycles corresponding to the latency signal LA. The latency control signal lat may be deactivated after being maintained in an activation state for 4 clock cycles corresponding to the burst length signal BLS. The enable signal generator 32 may generate the buffered clock signal PCLK as the column enable signal PCSLE in response to the latency control signal lat. Thus, 4 column enable signals PCSLE may be generated sequentially. The column decoder 20 may decode the column address CA to sequentially activate first to fourth column selecting signals CSL1 to CSL4 in response to the column enable signal PCSLE. Four column addresses CA may be generated by the internal address generator (not shown).

As shown in FIGS. 3A and 3B, the latency changes as the frequency of the clock signal varies, while the row enable signal PWL may be generated at the same time point. However, as the latency varies, a time at which the latency control signal lat is generated may vary. Thus, a time period spanning from the generation of the word line enable signal WL to the generation of the first column selecting signal CSL1 may be t1 in FIG. 3A and t2 in FIG. 3B. Time periods t1 and t2 may be different.

The time period from generation of the word line enable signal WL to generation of the first column selecting signal CSL1 may vary as the latency varies, depend on variations in process, voltage and/or temperature. As a result, if data of the bit line pair is not sufficiently amplified, the first column selecting signal CSL1 may be generated, and the data of the bit line may be read, which may result in data read errors.

SUMMARY OF THE INVENTION

Example embodiments of the present invention provide semiconductor memory devices which may generate more stable read data regardless of variations in latency, process, voltage and/or temperature. Example embodiments of the present invention provide a method for generating more stable read data regardless of variations in latency, process, voltage and/or temperature. A semiconductor device, according to an example embodiment of the present invention, may include a column enable signal generator, a row enable signal generator and/or a final column enable signal generator. The column enable signal generator may generate a latency control signal and a buffered clock signal as a column enable signal in response to the latency control signal. The latency control signal is activated after being delayed during a clock cycle corresponding to a latency signal when a read command is applied and deactivated after maintaining the activation state during a clock cycle corresponding to a burst length signal. The row enable signal generator may generate a row enable signal. The row enable signal is activated when a first time period lapses after a read command is applied and deactivated when a second time period lapses after the read command is applied. The final column enable signal generator may generate a first signal in response to the column enable signal. The first signal is activated after being delayed during a first clock cycle from a time when the column enable signal is activated. The final column enable signal generator may generate a second signal in response to the row enable signal. The second signal may be output as a first final column enable signal, and outputting the first signal as a second final column enable signal.

A semiconductor memory device, according to another example embodiment of the present invention, may include a column enable signal generator, a row enable signal generator and a final column enable signal generator. The column enable signal generator may generate a first latency control signal and may generate a buffered clock signal as a column enable signal in response to the first latency control signal. The first latency control signal is activated after being delayed during a clock cycle corresponding to a latency signal plus one clock cycle when a read command is applied and is inactivated after delaying by a clock cycle corresponding to a burst length signal minus one clock cycle. The row enable signal generator may generate a first row enable signal. The first row enable signal is activated when a first time period lapses after the read command is applied and is inactivated when a second time period lapses after the read command is applied. The final column enable signal generator may generate a second row enable signal in response to the first row enable signal, generate the second row enable signal as a final column enable signal, and then generate the column enable signal as the final column enable signal.

A semiconductor memory device, according to another example embodiment of the present invention, may include a first column enable signal generator, a row enable signal generator and a second column enable signal generator. The first column enable signal generator may generate a column enable signal. The row enable signal generator may generate a row enable signal. The second column enable signal generator may generate a second final column enable signal based on the column enable signal after generating a first final column enable signal based on the row enable signal. The first and second final column enable signals may generate sequentially.

In a method for generating a column enable signal in a semiconductor memory device, according to an example embodiment of the present invention, a column enable signal and a row enable signal may be generated. A second final column signal based on the column enable signal after generating a first final solumn signal based on the row enable signal. The first and second final column enable signals may be generated consecutively.

In a method for generating a column enable signal in a semiconductor memory device, according to another example embodiment of the present invention, a latency control signal may be generated. The latency control signal may be activated after being delayed for a clock cycle corresponding to a latency signal when a read command is applied, and deactivated after maintaining an activation state during a clock cycle corresponding to a burst length signal. A buffered clock signal may be generated as a column enable signal in response to the latency control signal. A row enable signal may be generated, activated when a first time period lapses after a read command is applied and deactivated when a second time period lapses after the read command is applied. A first signal may be generated in response to the column enable signal. The first signal may be activated after being delayed by a first clock cycle a time when the column enable signal is activated. A second signal may be generated in response to the row enable signal, and may be output as a final column enable signal. The first signal may be subsequently output as the final column enable signal.

In a method for generating a column enable signal in a semiconductor memory device, according to another example embodiment of the present invention, a first latency control signal may be generated. The first latency control signal may be activated after being delayed during a clock cycle corresponding to a latency signal plus one clock cycle when a read command is applied, and deactivated after maintaining an activation state during a clock cycle corresponding to a burst length signal minus one clock cycle. A buffered clock signal may be generated as a column enable signal in response to the first latency control signal. A row enable signal may be generated, activated when a first time period lapses after a read command is applied and deactivated when a second time period lapses after the read command is applied. A second row enable signal may be generated in response to the first row enable signal, and the second row enable signal may be generated as a final column enable signal. The column enable signal may be generated as the final column enable signal after generating the second row enable signal.

In example embodiments of the present invention, the final column enable signal generator a delay unit, a first signal generator, a second signal generator and a logical-sum circuit. The delay unit may delay the column enable signal by a clock cycle by one clock cycle. The first signal generator may perform a logical-product on the column enable signal and an output signal of the delay unit to generate the first signal. A second signal generator may generate the second signal which may be activated after being delayed for a third time period, and may be deactivated after a fourth time period has lapsed, in response to the row enable signal. The logical-sum circuit may perform a logical-sum on the first and second signals to generate the final column enable signal.

In example embodiments of the present invention, semiconductor memory devices may further include a command decoder for generating the read command and a mode setting command in response to a command signal. A mode setting circuit may receive a code signal applied from an external source to generate the latency signal and the burst length signal in response to the mode setting command. A clock buffer may buffer a clock signal applied from the external source to generate the buffered clock signal. A column decoder may receive and decode a column address to generate a column selecting signal in response to the final column enable signal. A row decoder may receive and decode a row address to generate a word line selecting signal in response to the row enable signal. A memory cell array may include memory cells accessed in response to the column selecting signal and the word line selecting signal.

In example embodiments of the present invention, the column enable signal generator may include a second latency control signal generator for generating a second latency control signal, which may be activated after being delayed for a clock cycle corresponding to a latency signal when a read command is applied. The latency control signal may be deactivated after maintaining the activation state for a clock cycle corresponding to a burst length signal. A first latency control signal generator may delay the second latency control signal for one clock cycle, and may perform a logical-product on the second latency control signal and the one clock cycle-delayed second latency control signal to generate the first latency control signal, in response to the buffered clock signal. An enable signal generator may generate the buffered clock signal as the column enable signal in response to the first latency control signal.

In example embodiments of the present invention, the final column enable signal generator may include a second row enable signal generator for generating the second row enable signal, which may be activated after being delayed for a third time period, and may be deactivated after a fourth time period has lapsed, in response the first row enable signal. A logical-sum circuit may logically-sum the column enable signal and the second row enable signal to generate the final column enable signal.

BRIEF DESCRIPTION OF THE DRAWINGS

The present invention will become more apparent to those of ordinary skill in the art by describing in detail some example embodiments thereof with reference to the attached drawings in which.

DETAILED DESCRIPTION OF EXAMPLE EMBODIMENTS OF THE PRESENT INVENTION

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
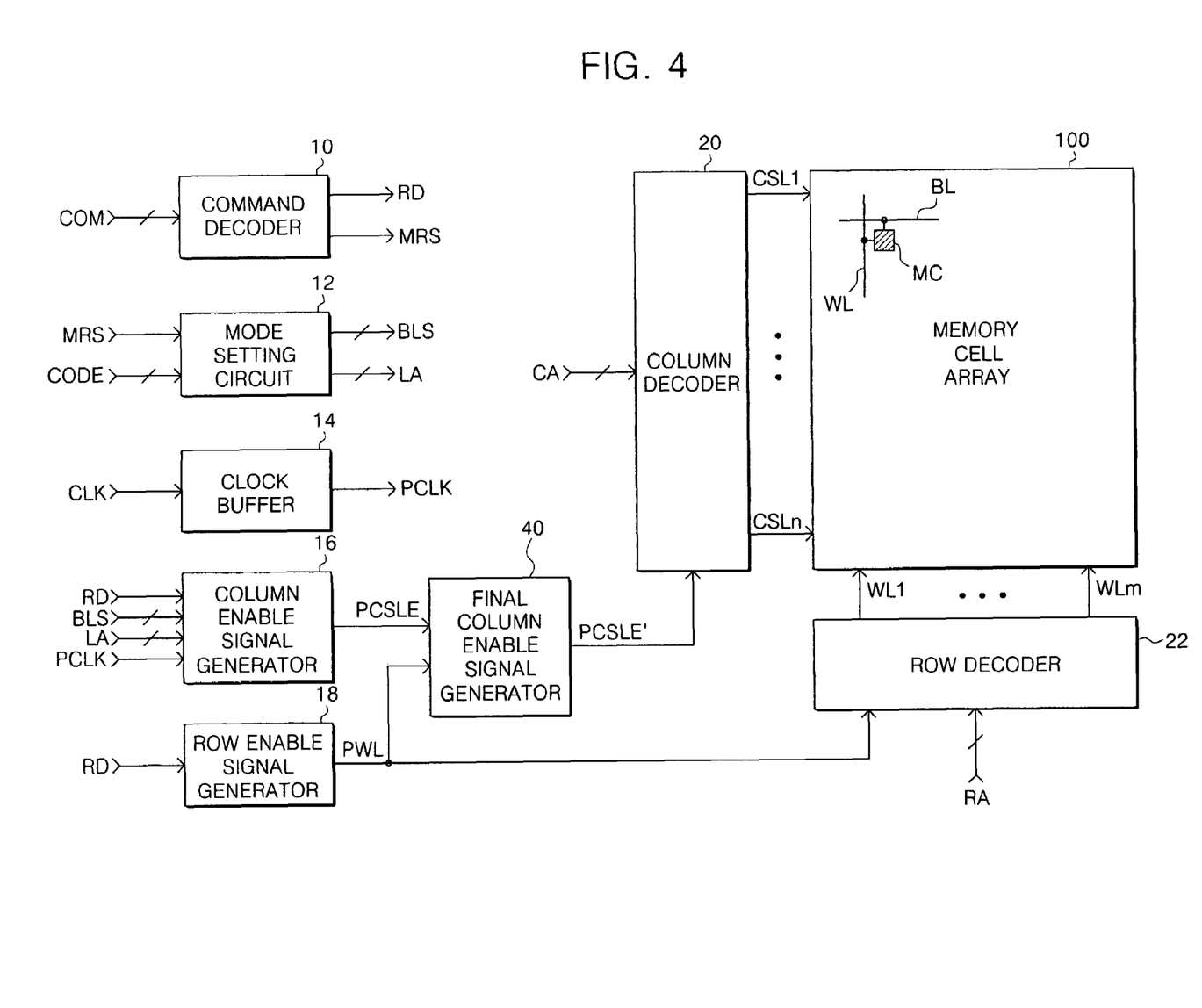
FIG. 4 is a block diagram illustrating a semiconductor memory device according to an example embodiment of the present invention.

FIG. 4 is a block diagram illustrating a semiconductor memory device according to an example embodiment of the present invention. As shown, the semiconductor memory device of FIG. 4 may be similar or substantially similar to the semiconductor memory device of FIG. 1, except that the semiconductor memory device of FIG. 4 may further include a final column enable signal generator 40. Like reference numerals of FIG. 1 and FIG. 4 denote like parts and perform like operations, and thus a detailed description of those reference numerals will be omitted for the sake of brevity.

The final column enable signal generator 40 may generate a final column enable signal PCSLE' and the column enable signal PCSLE output from the column enable signal generator 16 as the final column enable signal PCSLE', for example, in response to the row enable signal PWL. The row enable signal PWL may be output from the row enable signal generator 18. The column decoder 20 may decode the column address CA to activate one column selecting signal in response to the final column enable signal PCSLE'.

In at least this example embodiment, the semiconductor memory device may generate the final column enable signal PCSLE', which may be enabled after a given time period after the row enable signal PWL is generated. This may allow a time period from activation of the word line enable signal to activation of the final column enable signal PCSLE' to be constant or substantially constant regardless of the latency.

Figure 5:
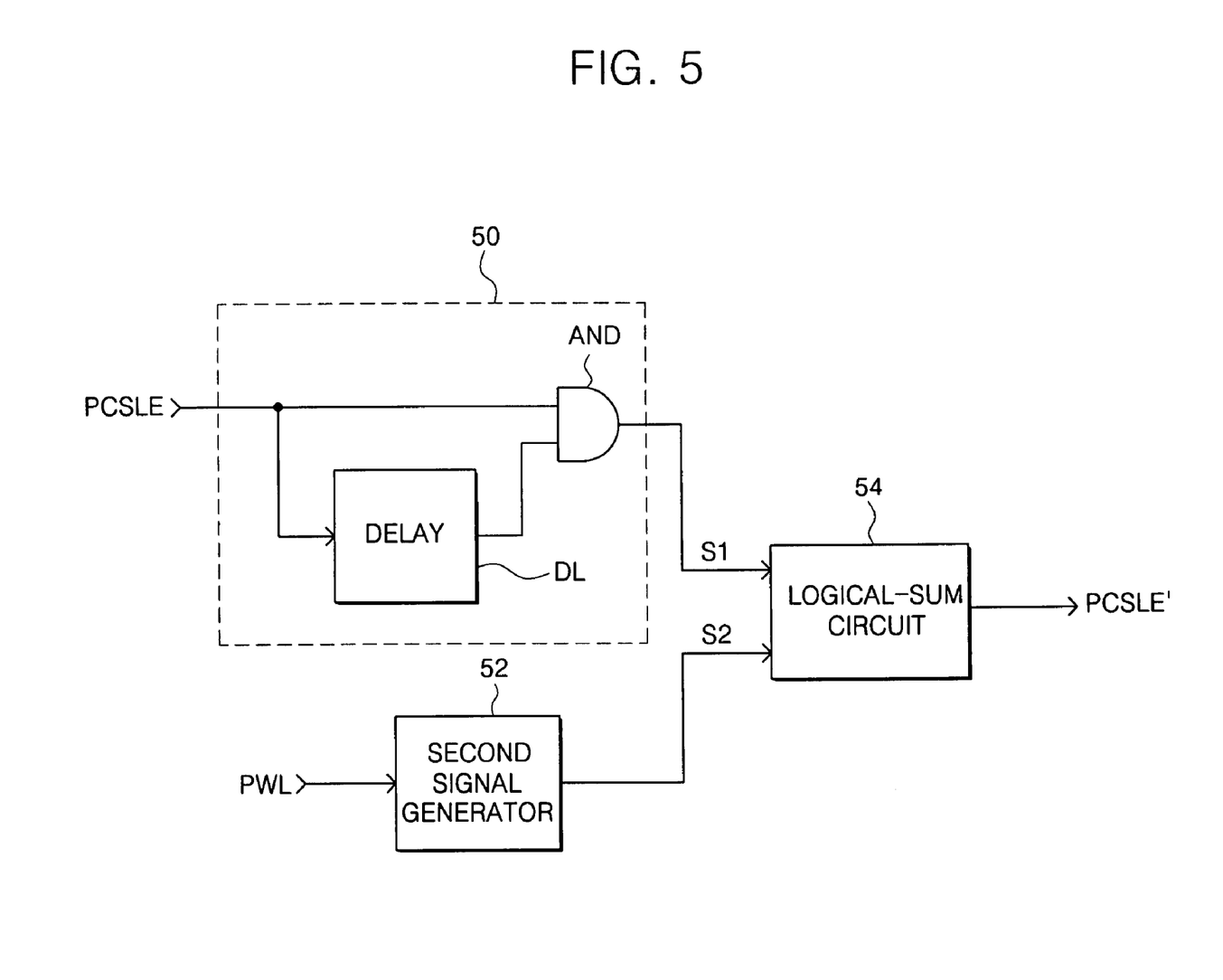
FIG. 5 is a block diagram illustrating a final column selecting signal generator according to an example embodiment of the present invention.

FIG. 5 is a block diagram illustrating the final column enable signal generator, according to an example embodiment of the present invention. The final column enable signal generator of FIG. 5 may be included in the semiconductor memory device of FIG. 4, and may include a first signal generator 50, a second signal generator 52 and/or a logical-sum circuit 54. The first signal generator 50 may further include a delay unit DL and/or an AND gate AND.

The delay unit DL may delay the column enable signal PCSLE for one clock cycle. The AND gate AND may logically sum an output signal of the delay unit DL and the column enable signal PCSLE to generate a first signal S1. The first signal S1 may be a signal from which the first activated column enable signal PCSLE of the column enable signal PCSLE is removed. The second signal generator 52 may generate a second signal S2. The second signal S2 may be activated a given time period after the row enable signal PWL is activated. The second signal S2 may be deactivated after maintaining the activation state for a given time period. The logical-sum circuit 54 may logically sum the first and second signals S1 and S2 to generate the final column selecting enable signal PCSLE'. For example, the logical-sum circuit 54 may generate the second signal S2 as the first activated final column selecting enable signal PCSLE' and generate the first signal S1 as the final column selecting enable signal PCSLE'.

Figure 6A:
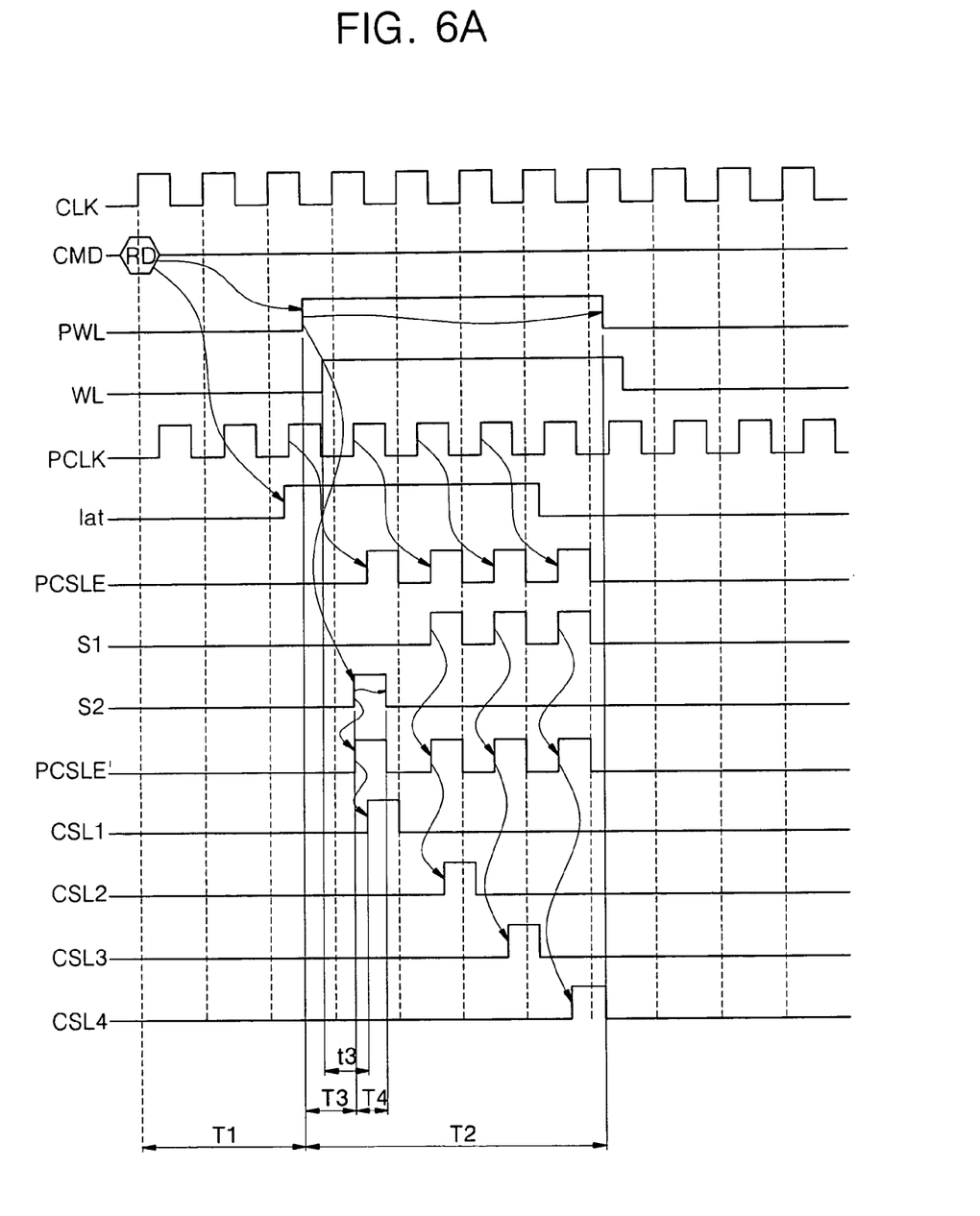
FIGS. 6A and 6B are timing diagrams illustrating an example operation of the semiconductor memory device of FIG. 4.

FIG. 6A is an example timing diagram illustrating an example operation of the semiconductor memory device of FIG. 4 in which the latency signal 1a is set to 2 and the burst length signal BLS is set to 4. As shown, the row enable signal PWL, the word line enable signal WL, the latency control signal lat, the buffered clock signal PCLK, and the column enable signal PCSLE may be generated in the same or substantially the same manner as discussed above with regard to FIG. 3A.

The delay unit DL of FIG. 5 may delay the column enable signal PCSLE for one clock cycle. The AND gate AND may logically product the output signals of the column enable signal PCSLE and an output signal of the delay unit DL to generate the first signal S1. The second signal generator 52 may generate the second signal S2. The second signal S2 may be activated after being delayed for a time period T3, and may be deactivated after a time period T4 has lapsed. The second signal S2 may be deactivated in response to the row enable signal PWL. As a result, the second signal S2 may be generated as the first activated final column enable signal PCSLE', and the column enable signal PCSLE may be generated as the second to fourth activated final column enable signals PCSLE'.

Figure 6B:
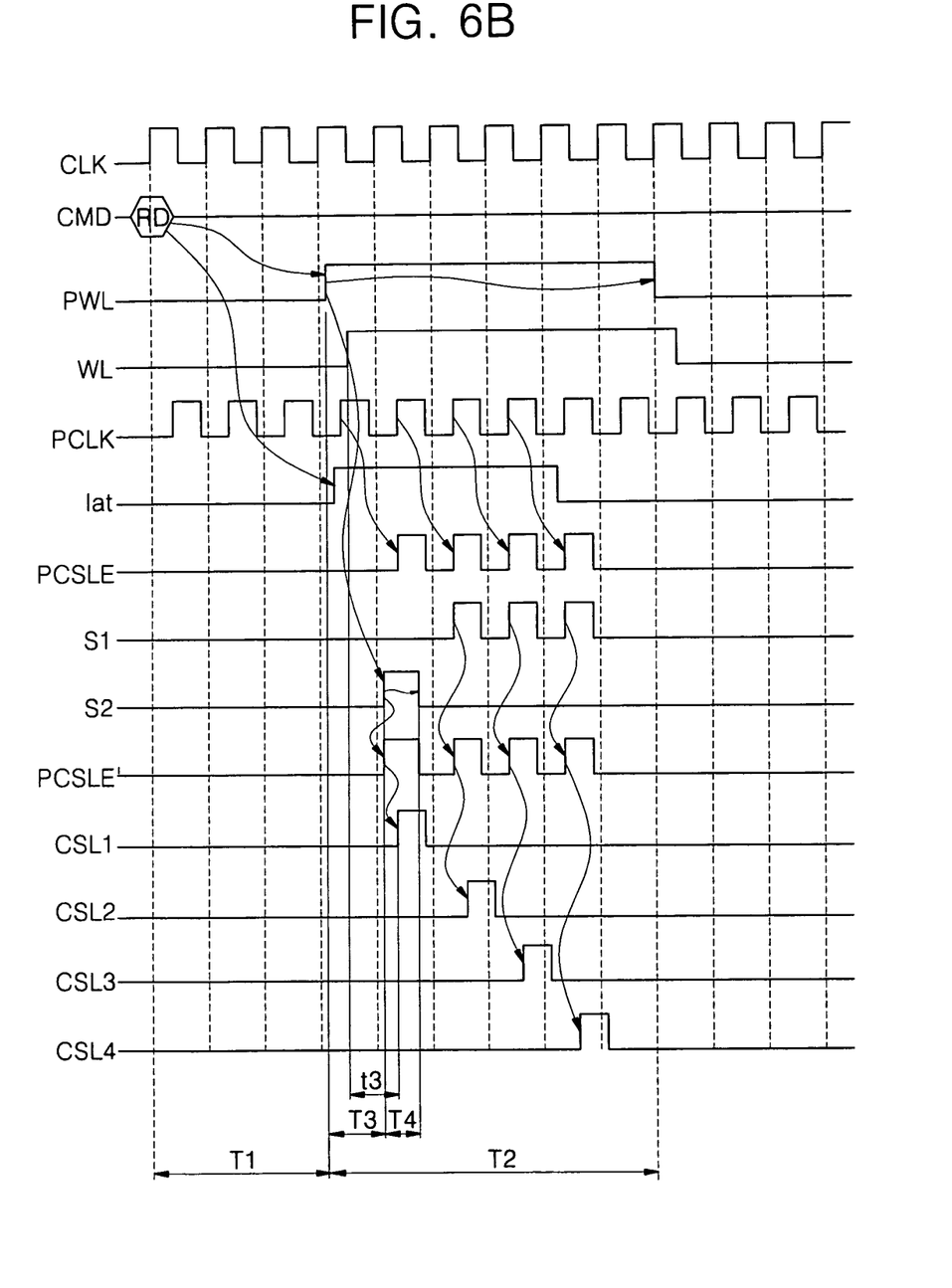

FIG. 6B is another example timing diagram illustrating an example operation of the semiconductor memory device of FIG. 4, in which the frequency of the clock signal is higher than the clock signal of FIG. 6A, the latency signal 1a is set to 3, and the burst length signal BLS is set to 4. As shown, the row enable signal PWL, the word line enable signal WL, the latency control signal lat, the buffered clock signal PCLK, and the column enable signal PCSLE may be generated in the same or substantially the same manner as discussed above with regard to FIG. 3B. The first signal generator 50 of FIG. 5 may remove the first column enable signal PCSLE of the column enable signal PCSLE to generate the first signal S1. The second signal generator 52 may generate the second signal S2. The second signal S2 may be activated after being delayed for a time period T3 and deactivated after a time period T4 has lapsed. The second signal S2 may be deactivated in response the row enable signal PWL. As a result, the second signal S2 may be generated as the first activated final column enable signal PCSLE', and the column enable signal PCSLE may be generated as the second to fourth final column enable signals PCSLE'.

As shown in FIGS. 6A and 6B, as the frequency of the clock signal CLK varies, the latency varies, but a time period from activation of the word line enable signal WL to activation of the column selecting signal CSL1 may be the same or substantially the same as time period t3 regardless of variations in latency. A time period from activation of the row enable signal PWL to activation of the final column enable signal PCSLE' may be the same or substantially the same as T3.

Figure 7:
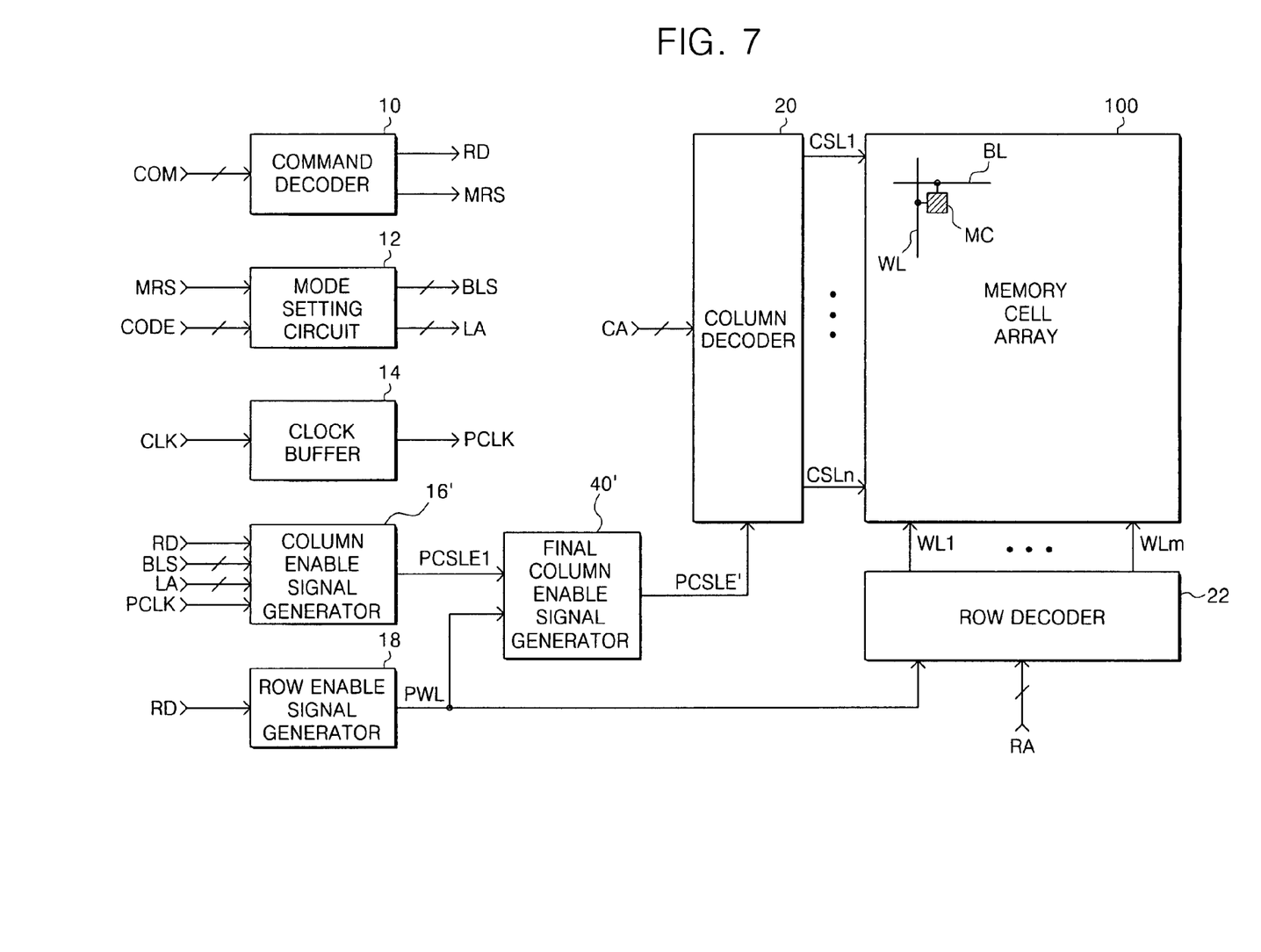
FIG. 7 is a block diagram illustrating a semiconductor memory device according to another example embodiment of the present invention.

FIG. 7 is a block diagram illustrating a semiconductor memory device according to another example embodiment of the present invention. The semiconductor memory device of FIG. 7 may be similar or substantially similar to the semiconductor memory device of FIG. 4, except that the column enable signal generator 16 of FIG. 4 may be replaced with a column enable signal generator 16', and the final column enable signal generator 40 of FIG. 4 may be replaced with a final column enable signal generator 40'.

Like reference numerals of FIGS. 4 and 7 denote like parts and perform like operations, and description of those reference numerals will be omitted for the sake of brevity.

The column enable signal generator 16' may receive the read command RD, the burst length signal BLS, the latency signal LA, and the buffered clock signal PCLK, and may generate a latency control signal (not shown). The latency control signal may be activated after being delayed for a clock cycle. The clock cycle may correspond to the latency signal LA plus one clock cycle after the read command RD is applied. The latency control signal may be deactivated after maintaining an activation state during a clock cycle corresponding to the burst length signal BLS minus one clock cycle. The column enable signal generator 16' may also generate the buffered clock signal PCLK as a column enable signal PCSLE1 in response to the latency control signal. The final column enable signal generator 40' may receive the row enable signal PWL and the column enable signal PCSLE1 to generate the final column enable signal PCSLE'. For example, the row enable signal PWL may be generated as the first activated final column enable signal PCSLE', and the column enable signal PCSLE1 may be generated as the final column enable signal PCSLE'.

Figure 8:
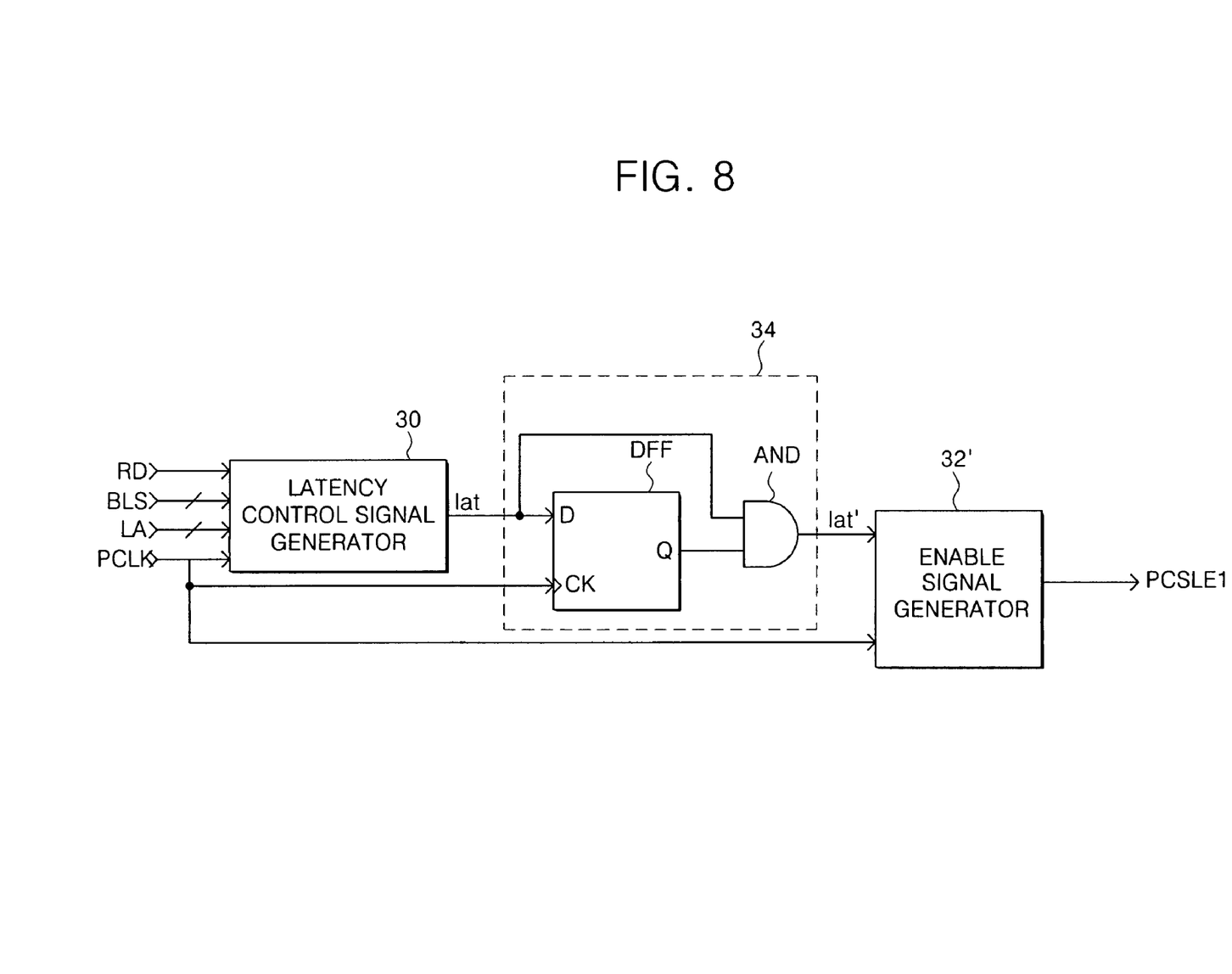
FIG. 8 is a block diagram illustrating a column enable signal generator according to an example embodiment of the present invention.

FIG. 8 is a block diagram illustrating the column enable signal generator according to an example embodiment of the present invention. The column enable signal generator of FIG. 8 may be included in the semiconductor memory device of FIG. 7. As shown, the column enable signal generator of FIG. 8 may be similar or substantially similar to the column enable signal generator of FIG. 2, except that the column enable signal generator of FIG. 8 may further include a D flip-flop DFF, and/or the enable signal generator 32 of FIG. 2 may be replaced with an enable signal generator 32'. Like reference numerals of FIGS. 2 and 8 denote like parts and perform like operations, and thus description of those reference numerals will be omitted for the sake of brevity.

Referring to FIG. 8, the D flip flop DFF may receive the latency control signal lat to generate a clock cycle-delayed latency control signal. The clock cycle-delayed latency control signal may be delayed by one clock cycle in response to the buffered clock signal PCLK. The AND gate AND may logically product the latency control signal lat and an output signal of the D flip flop DFF to generate a signal lat'. The signal lat' may be activated after being delayed by one cycle, and may be deactivated at the same or substantially the same time as the latency control signal lat. For example, the signal lat' generated from the circuit 34 may be a signal which may be activated after being delayed for a clock cycle corresponding to the latency signal 1a plus one clock cycle after the read command RD is applied. The signal lat' may be deactivated after maintaining an activation state for a clock cycle corresponding to the burst length signal BLS minus one clock cycle. The enable signal generator 32' may generate the buffered clock signal PCLK as the column enable signal PCSLE1 in response to the signal lat'.

Figure 9:
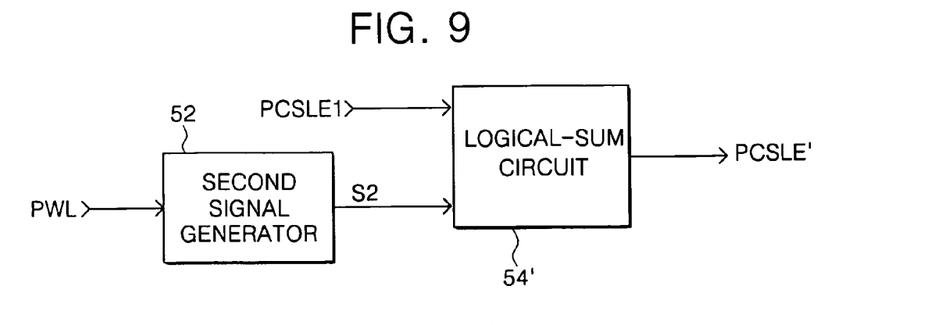
FIG. 9 is a block diagram illustrating a final column enable signal generator according to an example embodiment of the present invention.

FIG. 9 is a block diagram illustrating the final column enable signal generator, according to an example embodiment of the present invention. The final column enable signal generator of FIG. 9 may be included in the semiconductor memory device of FIG. 7. The final column enable signal generator of FIG. 9 may include a second signal generator 52 and/or a logical sum circuit 54'.

The second signal generator 52 of FIG. 9 may perform the same or substantially the same function as the second signal generator of FIG. 5, and the logical-sum circuit 54' may logically sum the second signal S2 and the column enable signal PCSLE1 to generate the final column enable signal PCSLE'. Thus, the row enable signal PWL may be generated as the first activated final column enable signal PCSLE', and the column enable signal PCSLE1 may be generated as the final column enable signal PCSLE'.

Figure 10A:
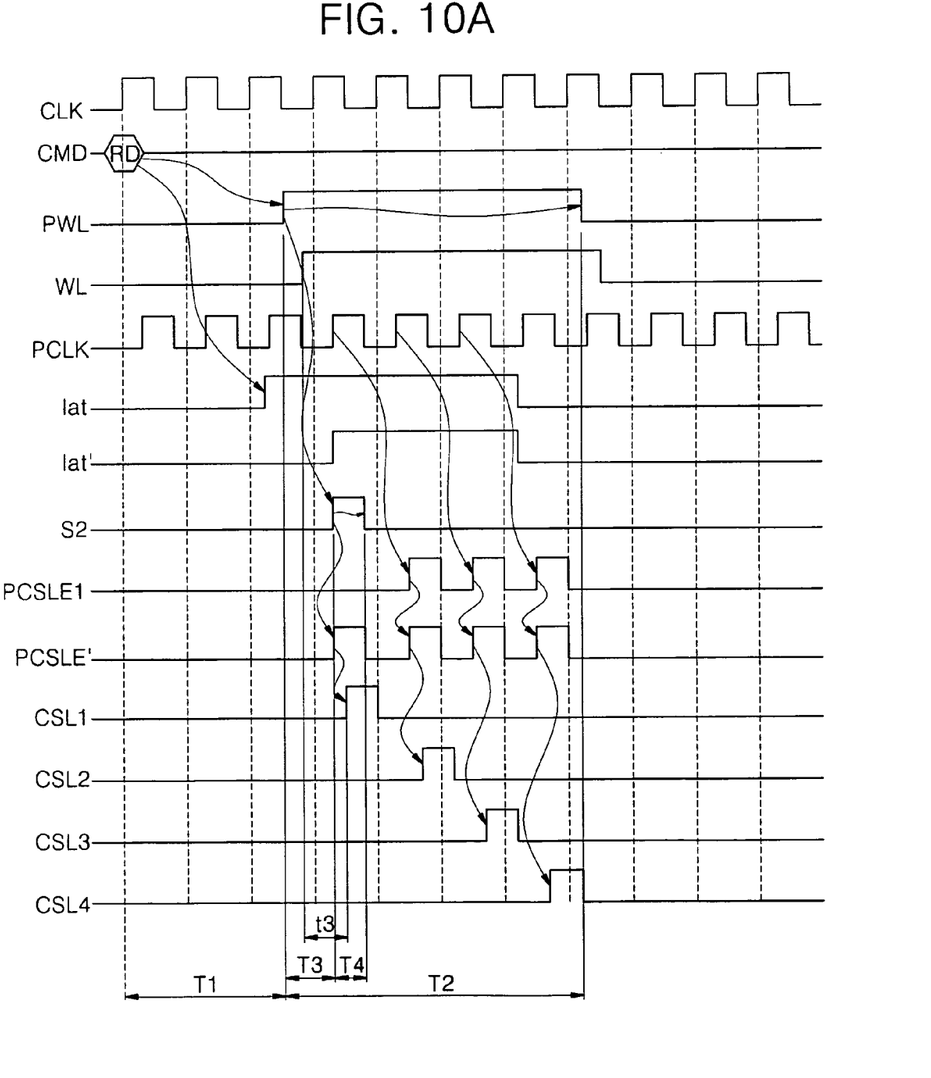
FIGS. 10A and 10B are timing diagrams illustrating an example operation of the semiconductor memory device of FIG. 7.

FIG. 10A is an example timing diagram illustrating an example operation of the semiconductor memory device of FIG. 7, where the latency signal 1a is set to 2, and the burst length signal BLS is set to 4. As shown, the row enable signal PWL, the word line enable signal WL, the latency control signal lat and the buffered clock signal PCLK may be generated in the same or substantially the same manner as described above with regard to FIG. 6A. The circuit 34 may generate the signal lat' which may be activated after being delayed for a clock cycle. The clock cycle may extend from activation of the latency control signal lat to deactivation of the latency control signal lat in response to the buffered clock signal PCLK. The enable signal generator 32' may generate the buffered clock signal PCLK as the column enable signal PCSLE1 in response to the signal lat'. The second signal generator 52 may generate the second signal S2. The second signal S2 may be activated after being delayed for a time period T3, and may be deactivated after a time period T4 has lapsed, in response the row enable signal PWL. The logical-sum circuit 54' may generate the second signal S2 as the first activated final column enable signal PCSLE' and the second to fourth column enable signals PCSLE1 as the second to fourth activated final column enable signals PCSLE'.

Figure 10B:
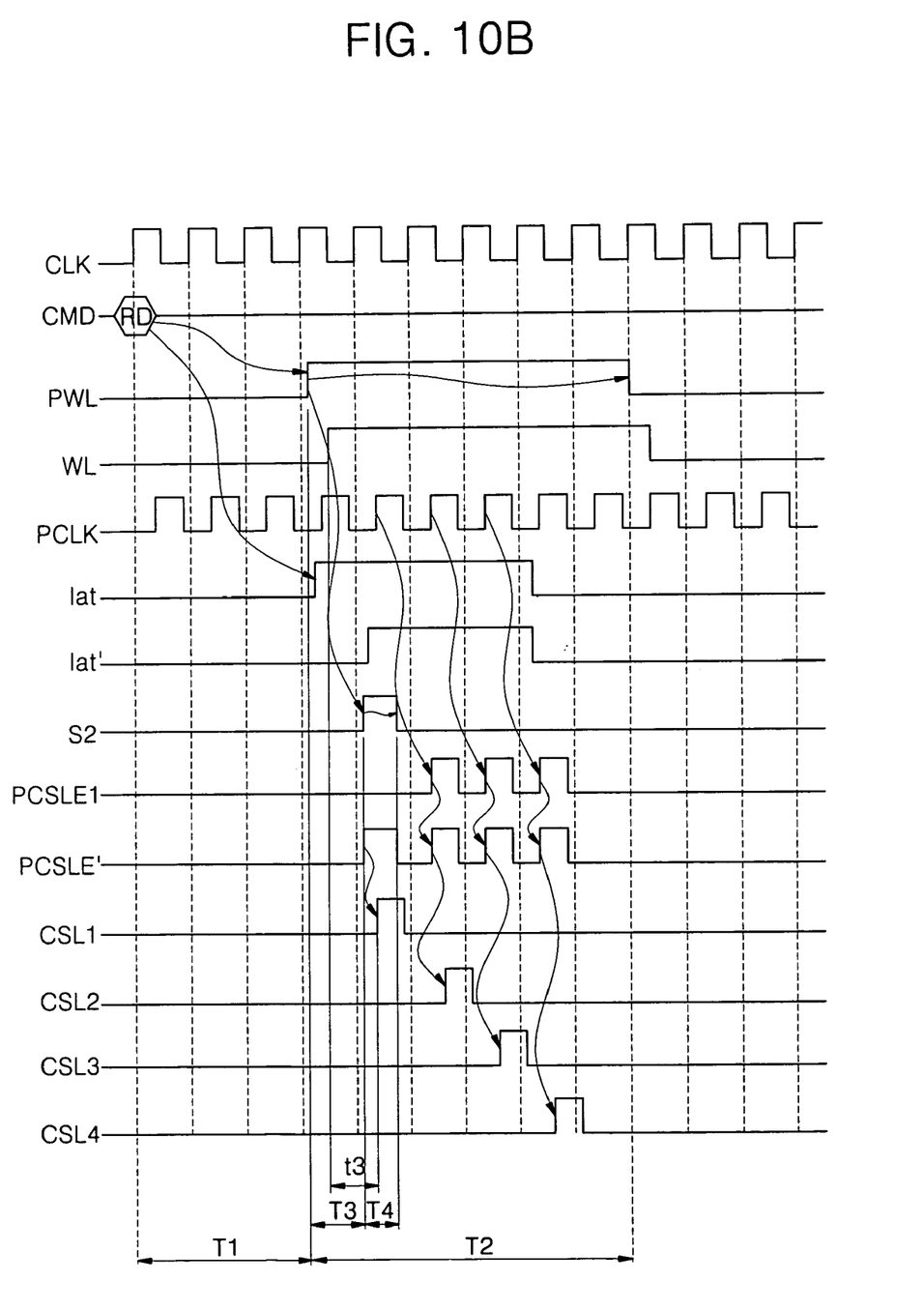

FIG. 10B is an example timing diagram illustrating an example operation of the semiconductor memory device of FIG. 7, in which the frequency of the clock signal is higher than the frequency of the clock signal of FIG. 10A, the latency signal 1a is set to 3, and the burst length signal BLS is set to 4. As shown, the row enable signal PWL, the word line enable signal WL, the latency control signal lat and the buffered clock signal PCLK may be generated in the same or substantially the same manner as described above with regard to FIG. 6B. The circuit 34 may generate the signal lat' which may be activated after being delayed for a clock cycle. The clock cycle may extend from activation of the latency control signal lat. The latency control signal lat may be deactivated in response to the buffered clock signal PCLK. The enable signal generator 32' may generate the buffered clock signal PCLK as the column enable signal PCSLE1 in response to the signal lat'. The second signal generator 52 may generate the second signal S2, which may be activated after being delayed for a time period T3. The second signal S2 may be deactivated after a time period T4 has lapsed, in response the row enable signal PWL. The logical sum circuit 54' may generate the second signal S2 as the first activated final column enable signal PCSLE'. The second to fourth column enable signals PCSLE1 may be generated as the second to fourth activated final column enable signals PCSLE'.

As shown in FIGS. 10A and 10B, as the frequency of the clock signal CLK varies, the latency varies, but a time period from activation of the word line enable signal WL to activation of the column selecting signal CSL1 may be the same or substantially the same as t3 regardless of variations in latency. A time period from activation of the row enable signal PWL to activation of the final column enable signal PCSLE' may be the same or substantially the same as T3.

As described herein, the column selecting signal may be generated such that data of the bit line pair may be sufficiently amplified because a time period from activation of the word line enable signal to activation of the column selecting signal may be constant or substantially constant regardless of variations in latency, process, voltage and/or temperature vary. Thus, data read errors may be suppressed, prevented and/or operation reliability of semiconductor memory devices may be increased.

What is claimed is:

1. A semiconductor memory device, comprising:
   a column enable signal generator for generating a latency control signal, the latency control signal being activated after being delayed during a clock cycle corresponding to a latency signal when a read command is applied and deactivated after maintaining the activation state during a clock cycle corresponding to a burst length signal, and generating a buffered clock signal as a column enable signal in response to the latency control signal;
   a row enable signal generator for generating a row enable signal, the row enable signal being activated when a first time period lapses after a read command is applied and deactivated when a second time period lapses after the read command is applied; and
   a final column enable signal generator for generating a first signal in response to the column enable signal, the first signal being activated after being delayed during a first clock cycle from a time when the column enable signal is activated, generating a second signal in response to the row enable signal, outputting the second signal as a first final column enable signal, and outputting the first signal as a second final column enable signal.

2. The device of claim 1, wherein the final column enable signal generator includes,
   a delay unit delaying the column enable signal by one clock cycle;
   a first signal generator performing a logical-product on the column enable signal and an output of the delay unit to generate the first signal,
   a second signal generator generating the second signal which is activated after being delayed during a third time period and deactivated after a fourth time period lapses, in response to the row enable signal, and
   a logical-sum circuit for performing a logical-sum on the first and second signals to generate the first and second final column enable signals.

3. The device of claim 1, further including,
   a command decoder generating the read command and a mode setting command in response to a command signal,
   a mode setting circuit for generating the latency signal and the burst length signal in response to the mode setting command and based on a code signal from an external source,
   a buffer for buffering a clock signal applied from the external source to generate the buffered clock signal,
   a column decoder receiving and decoding a column address to generate a column selecting signal in response to the final column enable signal,
   a row decoder receiving and decoding a row address to generate a word line selecting signal in response to the row enable signal, and
   a memory cell array having memory cells accessed in response to the column selecting signal and the word line selecting signal.

4. A semiconductor memory device, comprising:
   a column enable signal generator generating a first latency control signal which is activated after being delayed during a clock cycle corresponding to a latency signal plus one clock cycle when a read command is applied and is inactivated after delaying by a clock cycle corresponding to a burst length signal minus one clock cycle and for generating a buffered clock signal as a column enable signal in response to the first latency control signal;
   a row enable signal generator generating a first row enable signal which is activated when a first time period lapses after the read command is applied and is inactivated when a second time period lapses after the read command is applied; and
   a final column enable signal generator generating a second row enable signal in response to the first row enable signal, generating the second row enable signal as a final column enable signal, and then generating the column enable signal as the final column enable signal.

5. The device of claim 4, wherein the column enable signal generator includes:
   a second latency control signal generator generating a second latency control signal which is activated after being delayed during a clock cycle corresponding to a latency signal when a read command is applied and is inactivated after maintaining the activation state during a clock cycle corresponding to a burst length signal;
   a first latency control signal generator delaying the second latency control signal during one clock cycle and logical-producting the second latency control signal and the one clock cycle-delayed second latency control signal to thereby generate the first latency control signal, in response to the buffered clock signal; and
   an enable signal generator generating the buffered clock signal as the column enable signal in response to the first latency control signal.

6. The device of claim 5, wherein the final column enable signal generator includes:
   a second row enable signal generator generating the second row enable signal which is activated after being delayed during a third time period and is inactivated after a fourth time period lapses, in response the first row enable signal; and a logical-sum circuit logical-summing the column enable signal and the second row enable signal to generate the final column enable signal.

7. The device of claim 4, further comprising, a command decoder generating the read command and a mode setting command in response to a command signal;

a mode setting circuit receiving a code signal applied from an external portion to generate the latency signal and the burst length signal in response to the mode setting command;

a clock buffer buffering a clock signal applied from the external portion to generate the buffered clock signal;

a column decoder receiving and decoding a column address to generate a column selecting signal in response to the final column enable signal;

a row decoder receiving and decoding a row address to generate a word line selecting signal in response to the row enable signal; and a memory cell array having memory cells accessed in response to the column selecting signal and the word line selecting signal.

8. A method for generating a column enable signal in a semiconductor memory device, comprising:

a column enable signal generating step generating a latency control signal which is activated after being delayed during a clock cycle corresponding to a latency signal when a read command is applied and is inactivated after maintaining the activation state during a clock cycle corresponding to a burst length signal and generating a buffered clock signal as a column enable signal in response to the latency control signal;

a row enable signal generating step generating a row enable signal which is activated when a first time period lapses after the read command is applied and is inactivated when a second time period lapses after the read command is applied; and a final column enable signal generating step receiving the column enable signal to generate a first signal which is activated after being delayed by a first clock cycle a time when the column enable signal is activated, generating a second signal in response to the row enable signal, generating the second signal as a final column enable signal, and then generating the first signal as the final column enable signal.

9. The method of claim 8, wherein the final column enable signal generating step includes:

a delay step delaying the column enable signal by one clock cycle;

a signal generating step logical-producting the column enable signal and an output signal of a delay to generate the first signal and for generating the second signal which is activated after being delayed during a third time period and is inactivated after a fourth time period lapses, in response to the row enable signal; and a step logical-summing the first and second signals to generate the final column enable signal.

10. A method for generating a column enable signal in a semiconductor memory device, comprising:

a column enable signal generating step generating a first latency control signal which is activated after being delayed during a clock cycle corresponding to a latency signal plus one clock cycle when a read command is applied and is inactivated after maintaining the activation state during a clock cycle corresponding to a burst length signal minus one clock cycle and generating a buffered clock signal as a column enable signal in response to the first latency control signal;

a row enable signal generating step generating a first row enable signal which is activated when a first time period lapses after the read command is applied and is inactivated when a second time period lapses after the read command is applied; and a final column enable signal generating step generating a second row enable signal in response to the first row enable signal, generating the second row enable signal as a final column enable signal, and then generating the column enable signal as the final column enable signal.

11. The method of claim 10, wherein the column enable signal generating step includes:

a second latency control signal generating step generating a second latency control signal which is activated after being delayed during a clock cycle corresponding to a latency signal plus when a read command is applied and is inactivated after maintaining the activation state during a clock cycle corresponding to a burst length signal;

a first latency control signal generating step generating the first latency control signal by delaying the second latency control signal during one clock cycle in response to the buffered clock signal and logical-producting the second latency control signal and the one clock cycle-delayed second latency control signal; and an enable signal generating step generating the buffered clock signal as the column enable signal in response to the first latency control signal.

12. The method of claim 10, wherein the final column enable signal generating step includes:

generating the second row enable signal which is activated after being delayed during a third time period and is inactivated after a fourth time period lapses, in response the first row enable signal; and logical-summing the column enable signal and the second row enable signal to generate the final column enable signal.

13. A semiconductor memory device, comprising:

a first column enable signal generator for generating a column enable signal;

a row enable signal generator for generating a row enable signal; and a second column enable signal generator for generating a second final column enable signal based on the column enable signal after generating a first final column enable signal based on the row enable signal, and the first and second final column enable signals being generated sequentially.

14. The device of claim 13, wherein the second column enable signal generator includes, a delay unit for delaying the column enable signal, a first signal generator generating a first signal based on the column enable signal and an output of the delay unit, a second signal generator for generating a second signal based on the row enable signal, and a logic circuit for generating the first and second final column enable signals based on the first and second signals.

15. The device of claim 13, wherein the second column enable signal generator includes, a first signal generator for generating a first signal based on the row enable signal, and a logic circuit for generating the first and second final column enable signals based on the first signal and the column enable signal.

16. The device of claim 13, further including, a command decoder for generating a read command and a mode setting command in response to a command signal, a mode setting circuit receiving a code signal applied from an external source to generate a latency signal and a burst length signal in response to the mode setting command, a buffer for buffering a clock signal applied from the external source to generate the buffered clock signal, a column decoder for decoding a received column address to generate a column selecting signal in response to one of the first and second final column enable signal, a row decoder for decoding a received row address to generate a word line selecting signal in response to the row enable signal, and a memory cell array having memory cells accessed in response to the column selecting signal and the word line selecting signal.

17. A method for generating a column enable signal in a semiconductor memory device, the method comprising:

generating a column enable signal;

generating a row enable signal; and generating a second final column enable signal based on the column enable signal after generating a first final column enable signal based on the row enable signal, and the first and second final column enable signals being generated sequentially.

18. The method of claim 17, wherein the generating of the second column enable signal further includes, delaying the column enable signal, performing a logical-product on the column enable signal and the delayed column enable signal, generating the second signal in response to the row enable signal, and performing a logical-sum on the first and second signals to generate the first and second final column enable signals.

19. The method of claim 17, wherein the second row enable signal is generated as the first final column enable signal, and the column enable signal is generated as the second final column enable signal after the second row enable signal.

20. The method of claim 17, further including, generating a read command and a mode setting command in response to a command signal, generating a latency signal and a burst length signal in response to the mode setting command and based on a code signal from an external source, generating a buffered clock signal by buffering a clock signal from the external source, generating a column selecting signal by decoding a received a column address in response to the final column enable signal, generating a word line selecting signal in response to the row enable signal by decoding a row address in response to the row enable signal, and accessing memory cells in response to the column selecting signal and the word line selecting signal.

* * * * *